(12) United States Patent
Koseki

(10) Patent No.: US 9,670,583 B2
(45) Date of Patent: Jun. 6, 2017

(54) METHOD FOR ADJUSTING VAPOR-PHASE GROWTH APPARATUS

(71) Applicant: TAIYO NIPPON SANSO CORPORATION, Tokyo (JP)

(72) Inventor: Shuuichi Koseki, Yokohama (JP)

(73) Assignee: TAIYO NIPPON SANSO CORPORATION, Tokyo (JP)

( * ) Notice: Subject to any disclaimer, the term of this patent is extended or adjusted under 35 U.S.C. 154(b) by 0 days.

(21) Appl. No.: 14/779,715

(22) PCT Filed: Mar. 18, 2014

(86) PCT No.: PCT/JP2014/057421
§ 371 (c)(1),
(2) Date: Sep. 24, 2015

(87) PCT Pub. No.: WO2014/156853
PCT Pub. Date: Oct. 2, 2014

(65) Prior Publication Data
US 2016/0083846 A1    Mar. 24, 2016

(30) Foreign Application Priority Data
Mar. 29, 2013   (JP) ................................ 2013-070803

(51) Int. Cl.
*C23C 16/46* (2006.01)
*C23C 16/52* (2006.01)
*C23C 14/54* (2006.01)

(52) U.S. Cl.
CPC ............ *C23C 16/46* (2013.01); *C23C 14/541* (2013.01); *C23C 16/52* (2013.01)

(58) Field of Classification Search
CPC .................................. C23C 16/52; C23C 16/46
See application file for complete search history.

(56) References Cited

U.S. PATENT DOCUMENTS 4,051,270 A * 9/1977 Butler ................... C23C 14/562
                                                                118/664
5,001,327 A   3/1991 Hirasawa et al.
(Continued)

FOREIGN PATENT DOCUMENTS

JP   02-039525   2/1990
JP   03-291915   12/1991
(Continued)

OTHER PUBLICATIONS

Martin, Lisa C., et al., "Applications of Thin Film Thermocouples for Surface Temperature Measurement". NASA Technical Memorandum 106714, 1994, pp. 1-15.*
(Continued)

*Primary Examiner* — Bret Chen
(74) *Attorney, Agent, or Firm* — Nixon & Vanderhye P.C.

(57) ABSTRACT

A method of adjusting vapor-phase growth apparatuses in which the individual difference of a heater-set temperature and a surface temperature of substrate-mounted plate among the vapor-phase growth apparatuses is eliminated. The method of adjusting vapor-phase growth apparatuses includes a thermocouple-location-adjusting step, in which the relative location of a thermocouple and a heater is adjusted so that the change amount of the surface temperature of a substrate-mounted plate with respect to the change amount in the heater-set temperature reaches a predetermined value, and a temperature-control-value-correcting step, in which the thermocouple is disposed at the location adjusted in the thermocouple-location-adjusting step, the surface temperature of the substrate-mounted plate is obtained when the substrate-mounted plate is heated by the heater in accordance with a prescribed temperature-set value, and a temperature-control value with respect to a temperature-set value is corrected on the basis of the dif- (Continued)

ference between the temperature-set value at this time and the surface temperature of the substrate-mounted plate.

2 Claims, 5 Drawing Sheets

(56) References Cited

U.S. PATENT DOCUMENTS

| | | | | |
|---|---|---|---|---|
| 5,444,217 | A * | 8/1995 | Moore | C23C 16/4404 219/405 |
| 6,171,641 | B1 * | 1/2001 | Okamoto | C23C 16/463 204/192.13 |
| 6,507,007 | B2 * | 1/2003 | Van Bilsen | G01J 5/00 118/724 |
| 2003/0100136 | A1 * | 5/2003 | Dougherty | B01D 67/0072 438/50 |
| 2008/0143005 | A1 * | 6/2008 | Lim | C04B 35/565 264/29.2 |
| 2009/0074986 | A1 * | 3/2009 | Li | B82Y 30/00 427/585 |
| 2012/0052189 | A1 * | 3/2012 | Liu | C23C 14/044 427/8 |

FOREIGN PATENT DOCUMENTS

| | | |
|---|---|---|
| JP | 09-283454 | 10/1999 |
| JP | 2011-165907 | 8/2011 |

OTHER PUBLICATIONS

Negami, Takayuki, et al., "Real time composition monitoring methods in physical vapor deposition of CU(In,Ga)Se2 thin films." Mat. Res. Soc. Symp. Proc. vol. 426, pp. 267-278, 1996.*

Bahlawane, N., et al., "Noncatalytic thermocouple coatings produced with chemical vapor deposition for flame temperature measurements". Review of Scientific Instruments 78, 013905, pp. 1-7, 2007.*

International Search Report for PCT/JP2014/057421 mailed Jun. 24, 2014, two pages.

* cited by examiner

METHOD FOR ADJUSTING VAPOR-PHASE GROWTH APPARATUS

TECHNICAL FIELD

The present invention relates to a method for adjusting vapor-phase growth apparatuses for depositing a thin film on the substrate which is placed on the substrate-mounted plate, wherein in the apparatus, raw material gas is supplied to the substrate while heating the substrate by a heater which temperature is controlled using a thermocouple. Particularly, the present invention relates to a method for adjusting vapor-phase growth apparatuses in which the individual differences of a heater-set temperature and a substrate-mounted plate temperature which are generated among the apparatuses is eliminated.

This application is the U.S. national phase of International Application No. PCT/JP2014/057421 filed Mar. 18, 2014 which designated the U.S. and claims priority to Japanese Patent Application No. 2013-070803 filed on Mar. 29, 2013, the entire contents of each of which are hereby incorporated by reference.

BACKGROUND OF THE INVENTION

A vapor-phase growth apparatus generally includes a susceptor which is provided rotatably, a substrate-mounted plate which is provided on the susceptor and a substrate is placed on, and a heater which heats the substrate via the substrate-mounted plate in a deposition chamber. And in the vapor-phase growth apparatus, gas phase growth is performed on the substrate heated to a predetermined temperature. In this case, it is important that the temperature of the substrate surface has the same condition. Therefore, it is controlled by measuring the surface temperature of the substrate-mounted plate of the susceptor wherein the substrate is placed on the substrate-mounted plate.

As the controlling method, the surface temperature of substrate-mounted plate is measured by using a radiation thermometer, a non-contact thermometer or the like. In this case, it is unsuitable due to the inability to properly measure the surface temperature of the substrate-mounted plate because that the temperature display of the non-contact thermometer is changed by adhering the reaction product to the opposing surfaces constituting the channel which is an internal part of the apparatus and is positioned opposite the substrate-mounted plate.

Moreover, in order to avoid changing in the temperature display by depositing the reaction product, on the opposing surface, a hole may be formed on the opposed surface portions only corresponding to the optical path of the non-contact thermometer. However, there is a problem that the growth of the substrate becomes inhomogeneous because that the raw material flows out from the hole, or the atmosphere outside the opposed surface flows in and arrives to the growth surface.

For these reasons, for example, as disclosed in Patent Document 1, a feedback-controlled method is used by measuring a temperature of the heater by using a thermocouple.

[Patent Document 1] Japanese Patent Publication No. 2011-165907

SUMMARY OF THE INVENTION

However, even multiple vapor-phase growth apparatuses are the same model, since each internal part of the apparatuses have an individual difference among the multiple apparatuses, even if the same heater-set temperature it set, it is difficult to obtain the same surface temperature of substrate-mounted plates.

This point will be specifically described with reference to FIG. 5. FIG. 5 shows relationships of heater-set temperatures and surface temperatures of substrate-mounted plates using the apparatuses A, B and C with the same type. The horizontal axis represents heater-set temperatures (° C.), and the vertical axis represents surface temperatures of substrate-mounted plate (° C.).

Surface temperatures of substrate-mounted plates of the apparatuses A, B and C when setting the heater-set temperature to 800° C. are 820° C., 805° C. and 777° C., respectively.

In addition, surface temperatures of substrate-mounted plate of apparatuses A, B and C when the heater-set temperature is set to 1200° C. are 1115° C., 1106° C. and 1085° C., respectively.

In this way, even the same heater-set temperature is set, the surface temperatures of the substrate-mounted plates are different among the apparatuses.

To decrease the individual differences of the internal parts, it is possible to use a method of investigating a relationship between the heater-set temperature and the surface temperature of substrate-mounted plate by raising temperature by the heater, adjusting or replacing the internal parts after opening the reactor. However, the method is unsuitable in practical use because that opening the reactor requires cooling the reactor and in addition, in order to confirm the effect, it is necessary to increase the temperature after re-assembling the equipment.

Although it is possible to separately revise the operation program of the each vapor-phase growth apparatus on the basis of the heater-set temperatures in consideration of the above individual difference, in recent years, since a number of apparatuses may be operated, it is complicated to create a different operation program in each apparatus.

In order to solve this problem fundamentally, there is a demand of eliminating an individual difference of a heater-set temperature and a surface temperature of substrate-mounted plate, and obtaining the same surface temperature of substrate-mounted plate when setting the same heater temperature.

The present invention has been made in order to solve the above-mentioned problems in order to provide a method of adjusting the vapor-phase growth apparatus to eliminate an individual difference of heater-set temperature and surface temperature of substrate-mounted plate among vapor-phase growth apparatuses.

The inventors, in order to solve the above problems, have investigated the individual difference and also investigated how to adjust the individual difference of each apparatus.

First, as shown in FIG. 5, the individual difference of each apparatus is further described.

As shown in FIG. 5, it can be seen that the slope and intercept of the graph are different for each device.

Here, the slope of the graph is a change amount of a heating temperature of the substrate-mounted plate with respect to a change amount of a heater-set temperature (hereinafter, simply refer to "temperature change rate").

As described above, the heater heating value is controlled so as to set the temperature measured by the thermocouple to the value of the heater-set temperature, and regarding the temperature change rate, the increase of the heater-set temperature and the increase of the surface temperature of substrate-mounted plate are not the same values because that the relative distance between the heater and the substrate-mounted plate and the relative distance between the heater and the thermocouple are different. For example, when the heater-set temperature rises to 400° C. from a certain temperature, the surface temperature of substrate-mounted plate rises to 300° C. In this case, the temperature change rate is represented by 300° C./400° C.

The intercept is a value related to surface temperature of substrate-mounted plate when the heater-set temperature of each device is set to a predetermined temperature.

To adjust the individual difference (make a relationship between a heater-set temperature and a surface temperature of substrate-mounted plate of each apparatus to the same one), it is possible to adjust the intercepts and the slopes of the graphs (temperature change rates) in FIG. 5 at each apparatus so as to obtain the same straight line.

Regarding the intercepts, it is relatively easy to adjust them at each apparatus by correcting the heater-set temperature in the control software of the apparatus (specifically, correcting the heater temperature control value with respect to the heater temperature-set value. Detail will be shown below).

So inventors have conducted intensive studies on how to adjust the temperature change rate of each apparatus. As a result, the finding that the relative distance of the heater and thermocouple is closely related to the rate of temperature change is observed. It will be explained below.

FIG. 6 schematically represents the relationships between heater heating values and surface temperatures of substrate-mounted plate when the heater-set temperature of an apparatus is constant by using each relative distance of the heater and the thermocouple. The relative distances between the heaters and the thermocouples decrease in the order of FIG. 6(a), FIG. 6(b) and FIG. 6(c).

When the heater-set temperatures at FIG. 6(a), FIG. 6(b) and FIG. 6(c) are the same value, as the relative distances between the heater and the thermocouple become larger, the temperatures measured by the thermocouple become lower. For example, the temperature measured by the thermocouple of FIG. 6(a) shows the lowest value among the others.

As described above, since the heating value of the heater is controlled by the device of controlling heater 35 based on the temperature measured by the thermocouple, as the relative distances between the heater and the thermocouple become larger, when the heaters are controlled so as to raise the heater temperature, as a result, the surface temperature of substrate-mounted plate becomes higher. That is, when the heater-set temperature is the same, the surface temperature of substrate-mounted plate in the case of FIG. 6(a) is the highest one, and the other surface temperatures becomes lower in the order of FIG. 6(b) and FIG. 6(c).

For example, when the heater-set temperature is set to 800° C., the surface temperature of substrate-mounted plate in the case of FIG. 6(a), FIG. 6(b) and FIG. 6(c) are about 715° C., 670° C. and 590° C., respectively.

Next, each surface temperature of substrate-mounted plate in FIG. 6(a), FIG. 6 (b) and FIG. 6(c) were measured when changing the heater-set temperature from 800° C. (a) to 1200° C.

FIG. 7 shows graphs of the measurement results. The horizontal axis represents heater-set temperatures, the vertical axis represents surface temperature of the substrate-mounted plate, and the graphs in FIGS. 7(a) to (c) correspond to FIGS. 6(a) to (c).

When the heater-set temperatures were set to 1200° C., the surface temperature of substrate-mounted plate are about 1140° C., 970° C. and 790° C. in FIG. 6(a), FIG. 6(b) and FIG. 6(c), respectively.

In FIG. 6(a), as shown as the graph (a) in FIG. 7, when the heater-set temperature is set to 800° C., the surface temperature of substrate-mounted plate is about 715° C.; and when the heater-set temperature is set to 1200° C., the surface temperature of substrate-mounted plate is about 1140° C. That is, the surface temperature of substrate-mounted plate increases 425° C. when the heater-set temperature increases 400° C., and therefore, the temperature change rate is 425° C./400° C.

In FIG. 6(b), as shown as graph (b) of FIG. 7, when the heater-set temperature is set to 800° C., the surface temperature of substrate-mounted plate is about 670° C.; when the heater-set temperature is set to 1200° C., the surface temperature of substrate-mounted plate is about 970° C., and therefore, the temperature change rate is 300° C./400° C.

In FIG. 6(c), as shown as the graph in FIG. 7(c), when the heater-set temperature is set to 800° C., the surface temperature of substrate-mounted plate is about 590° C.; when the heater-set temperature is set to 1200° C., the surface temperature substrate-mounted plate is about 790° C., and therefore, the temperature change rate is 200° C./400° C.

Thus, FIG. 6(a) which has the farthest relative distance between the heater and the thermocouple (see graph (a) in FIG. 7) shows the highest temperature change rate. Therefore, when it is desired to increase the temperature change rate, it is possible to increase the relative distance between the heater and the thermocouple, on the other hand, when it is desired to reduce the temperature change rate, it is possible to decrease the relative distance between the heater and thermocouple.

Thus, the temperature change rate is adjustable by adjusting the relative distance between the heater and thermocouple. When the temperature change rate may be adjusted, as described above, it is sufficient to correct the intercept on the control software (see FIG. 8).

The present invention has been made based on such findings, and specifically it is composed of the following configurations.

(1) A method of adjusting vapor-phase growth apparatuses in which an individual difference of a heater-set temperature and a surface temperature of a substrate-mounted plate temperature among the vapor-phase growth apparatuses is eliminated wherein the vapor-phase growth apparatuses are apparatuses in which a thin film is deposited on a substrate placed on a substrate-mounted plate by supplying raw material gas on the substrate while heating the substrate by a heater which is controlled by a thermocouple, wherein the method comprises: a thermocouple-location-adjusting step, in which a relative location of the thermocouple and the heater is adjusted so that an change amount of a surface temperature of the substrate-mounted plate with respect to an change amount in a heater-set temperature reaches a predetermined value; and a temperature-control-value-correcting step, in which the thermocouple is disposed at the location adjusted in the thermocouple-location-adjusting step, a surface temperature of the substrate-mounted plate is obtained when the substrate-mounted plate is heated by the heater in accordance with a prescribed temperature-set value, and a temperature-control value with respect to a temperature-set value is corrected on a basis of a difference between the temperature-set value at this time and the temperature of the substrate-mounted plate.

(2) Moreover, the method of adjusting a vapor-phase growth of (1), in the temperature-control-value-correcting step, a correction value is determined on the basis of a difference between the temperature-set value and the measured value and the change amount of the surface temperature of the substrate-mounted plate with respect to the change amount of the heater-set temperature.

In the present invention, it is possible to eliminate the individual difference of the heater-set temperature and the surface temperature of the substrate-mounted plate among the vapor-phase growth apparatuses by adjusting the relative location of the heater and thermocouple so that the temperature change rate (change amount of the heating temperature of the substrate-mounted plate with respect to the change amount of the heater-set temperature) is a predetermined value, and by correcting the heater temperature control value with respect to the heater temperature-set value.

Then, by performing such adjustment for each apparatus, it is possible to obtain the same surface temperature of substrate-mounted plate by setting the same heater-set temperature.

DETAIL DESCRIPTION OF THE INVENTION

Figure 1:
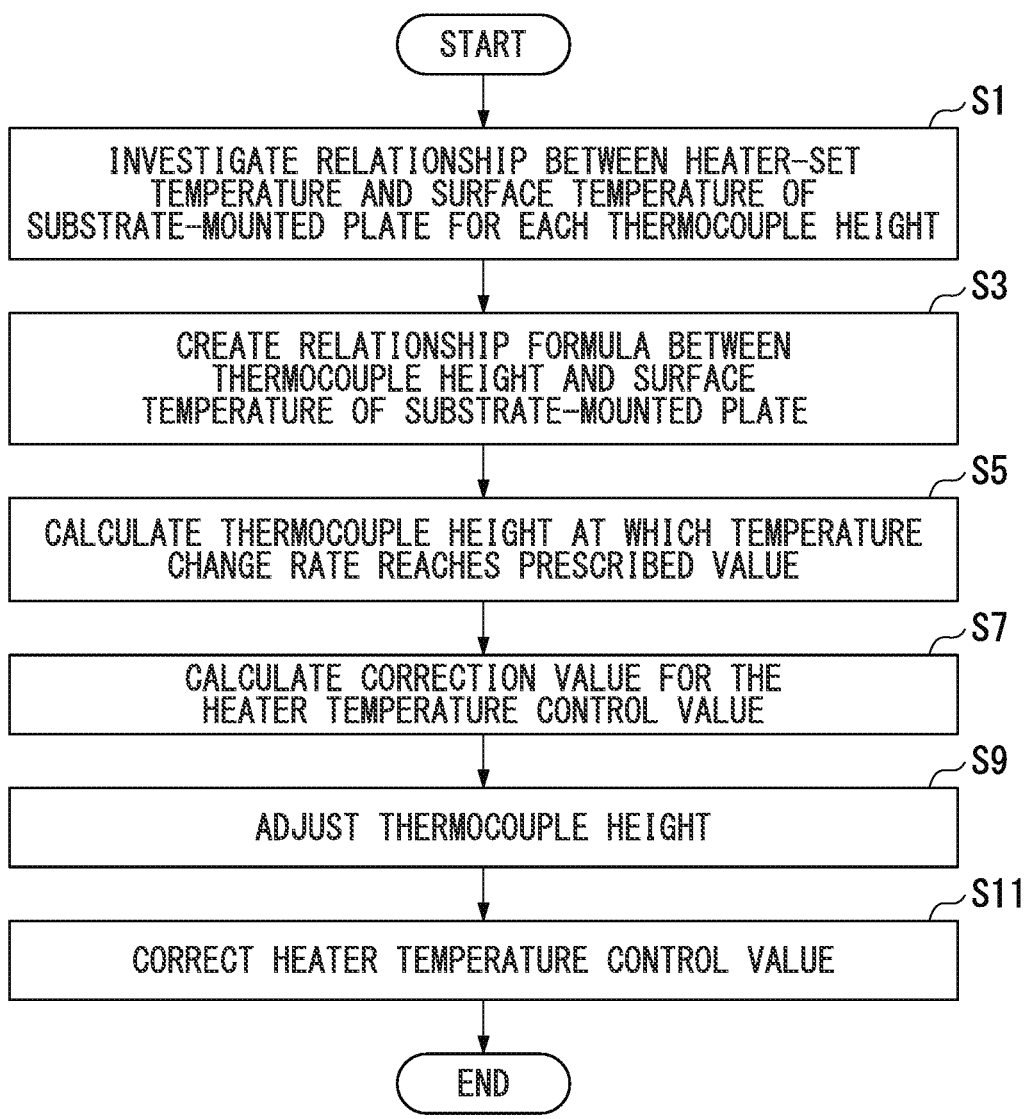
FIG. 1 is a flowchart illustrating the flow of the method of adjusting vapor-phase growth apparatuses according to an embodiment of the present invention.
Figure 2A:
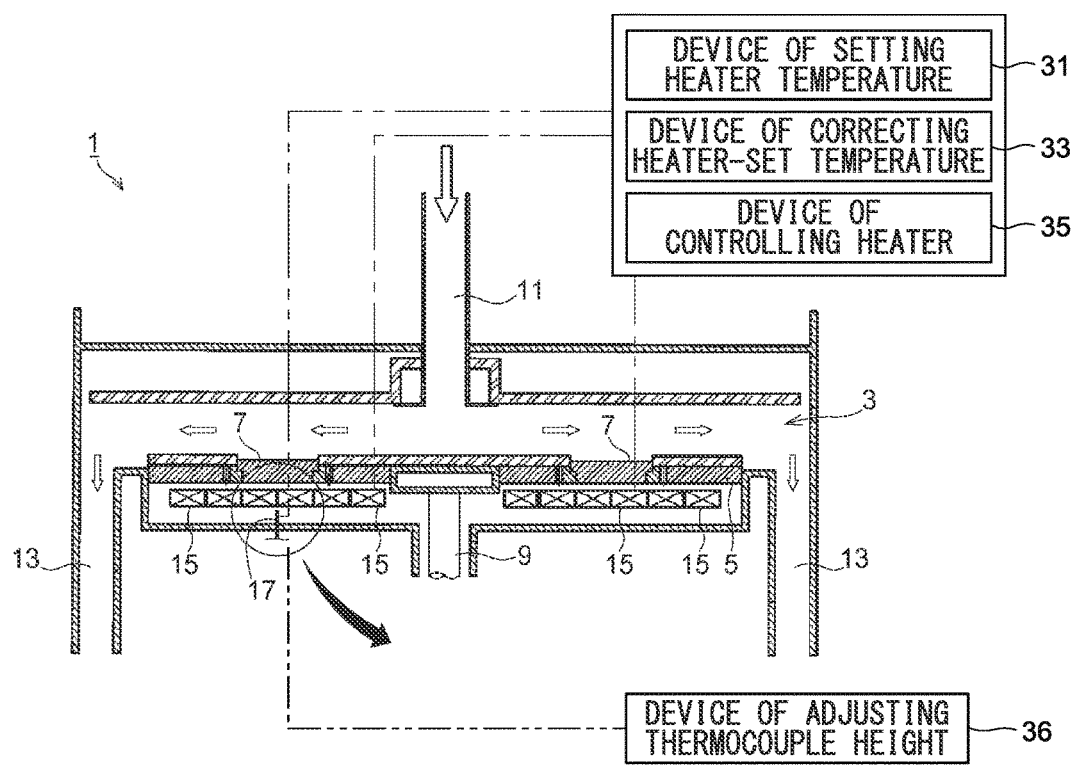
FIG. 2A is an explanatory view for illustrating a vapor-phase growth apparatus which is the adjusting target of the method of adjusting a vapor-phase growth apparatus according to an embodiment of the present invention, and is an elevational sectional view through the center of the unit.
Figure 2B:
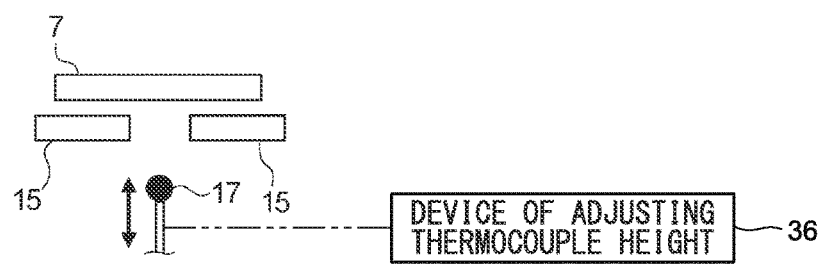
FIG. 2B is an explanatory view for illustrating a vapor-phase growth apparatus which is the adjusting target of the method of adjusting a vapor-phase growth apparatus according to an embodiment of the present invention, and is an enlarged view for illustrating the arrangement of the substrate-mounted plate and the heater and the thermocouple.

Before describing the method of adjusting the vapor-phase growth apparatus of the present embodiment, first, a vapor-phase growth apparatus 1 which is the adjusting target of the method of adjusting the vapor-phase growth apparatus will be outlined with reference to FIGS. 2A and 2B.

The vapor-phase growth apparatus 1 includes a flat cylindrical deposition chamber 3, a disk-shaped susceptor 5 rotatably supported by a rotation axis 9 penetrating the bottom portion of the deposition chamber 3, a substrate-mounted plate 7 which is rotatably provided on the outer circumferential portion of the susceptor 5 in which a plurality of substrate-mounted plates 7 are placed, a heater 15 for heating the substrate through the substrate-mounted plate 7, a thermocouple 17 for measuring the temperature of the heater 15, a device of setting heater temperature 31 for setting the temperature of the heater 15, a device for correcting heater-set temperature 33 for correcting the heater-set temperature in any of the correction value set, and a device of controlling heater 35 for controlling the heating value of the heater 15 based on the heater temperature measured by thermocouple 17 and the heater-set temperature.

In the central portion of the surface side of the susceptor 5 of the deposition chamber 3, a gas inlet 11 for introducing raw material gas (for example, trimethyl gallium and ammonia) is provided, and a gas outlet 13 is provided on the outer peripheral portion.

The heater 15 is provided in a lower portion of the deposition chamber 3. The thermocouple 17 is disposed below the heater 15 so that it can be moved upward (in the direction to approach the heater 15) within a certain height in a reference (see FIG. 2B). In this embodiment, changing the relative distance of the heater 15 and thermocouple 17 is carried out by increasing the height of thermocouple 17. Increasing the height of the thermocouple means that the relative distance of the heater 15 and thermocouple 17 decreases.

A method of controlling the heater 15 is described below. As described above, the heater 15 is controlled by the device of controlling heater 35. The device of controlling heater 35 carries out a feedback control to the heating value of the heater 15 so that the temperature measured by thermocouple 17 becomes the heater temperature control value. The heater temperature control value is usually set to the heater-set temperature set by an operator.

Specifically, when the temperature measured by thermocouple 17 is lower than the heater temperature control value, the device of controlling heater 35 increases the heating value of the heater 15. On the contrary, when the temperature measured by thermocouple 17 is higher than the heater temperature control value, the device of controlling heater 35 reduces the amount of heat generated.

Thus, the device of controlling heater 35 carries out controlling on the basis of the two temperatures of the heater temperature control value and the temperature measured by thermocouple 17. The device of correcting heater-set temperature 33 is provided for correcting the heater temperature control value by using any pre-set correction value.

For example, when the heater-set temperature is 800° C. and the operator set the correction value to +50° C., the device of correcting heater-set temperature 33 corrects the heater-set temperature of 800° C. to the heater temperature control value of 850° C. by adding 50° C. The device of controlling heater 35 controls the heating value of the heater 15 by referring to the corrected heater temperature control value of 850° C. so that the temperature measured by thermocouple 17 becomes to 850° C.

The substrate-mounted plate 7, as shown in FIGS. 2A and 2B, is exposed the heater 15 on the bottom surface side, and is capable of transferring heat efficiently to the substrate by directly receiving the radiation from the heater 15.

The vapor phase growth method of forming a thin film on a substrate by using the vapor-phase growth apparatus 1 described as above is outlined.

First, the substrate is heated to a predetermined temperature through the substrate-mounted plate 7 by the heater 15. During heating, as described above, the heating value of the heater 15 is controlled based on the temperature measured by the thermocouple 17.

When the susceptor 5 rotates by the rotation axis 9 at a predetermined speed, the substrate-mounted plate 7 rotates in conjunction with the rotation of the susceptor 5. By doing so, the substrate is in a rotation-revolution state.

In this state, a predetermined raw material gas is introduced into the upper surface side of the susceptor 5 of the deposition chamber 3 from the gas inlet 11. When the raw gas passes through the upper side of the substrate, it is possible to uniformly deposit a predetermined thin film on the top surface of the substrate. Then, the raw material gas is discharged from the gas outlets 13 which are provided in the outer periphery.

Based on the above, the method of adjusting the vapor-phase growth apparatus of the present embodiment will be explained with reference to FIGS. 1 to 4 by using an example of adjusting the vapor-phase growth apparatus 1.

It is a goal of this embodiment that the surface temperature of substrate-mounted plate is 800° C. when the heater-set temperature is set to 800° C., and the surface temperature of substrate-mounted plate is 1100° C. when the heater-set temperature is set to 1200° C. The temperature change rate in this case is 300° C./400° C. As the goal of such an adjustment, it is preferable to set the goal to the easiest adjustment for each model (e.g. the average of the apparatuses, etc.).

A method of adjustment evaluation includes setting the reference range of the surface temperature of substrate-mounted plate for each heater-set temperature, and observing whether it falls within its scope. The reference range of the surface temperature of substrate-mounted plate is 800±2.5° C. when the heater-set temperature is set to 800° C., and the surface temperature of substrate-mounted plate 1100±5.0° C. when the heater-set temperature is set to 1200° C.

As described above, the adjustment is performed according to both of the temperature change rate and the heater temperature control value. For this purpose, the method of adjusting vapor-phase growth apparatuses according to the present embodiment includes a thermocouple-location-adjusting step of adjusting the thermocouple heights to set the temperature change rate to a predetermined value, and a temperature-control-value-correcting step for correcting the heater temperature control value with respect to the heater temperature-set value.

Each step is described in detail below.

<Thermocouple-Location-Adjusting Step>

First, the thermocouple-location-adjusting step will be explained. In this step, the temperature change rate is corrected to 300° C./400° C. by adjusting the thermocouple height.

Figure 3:
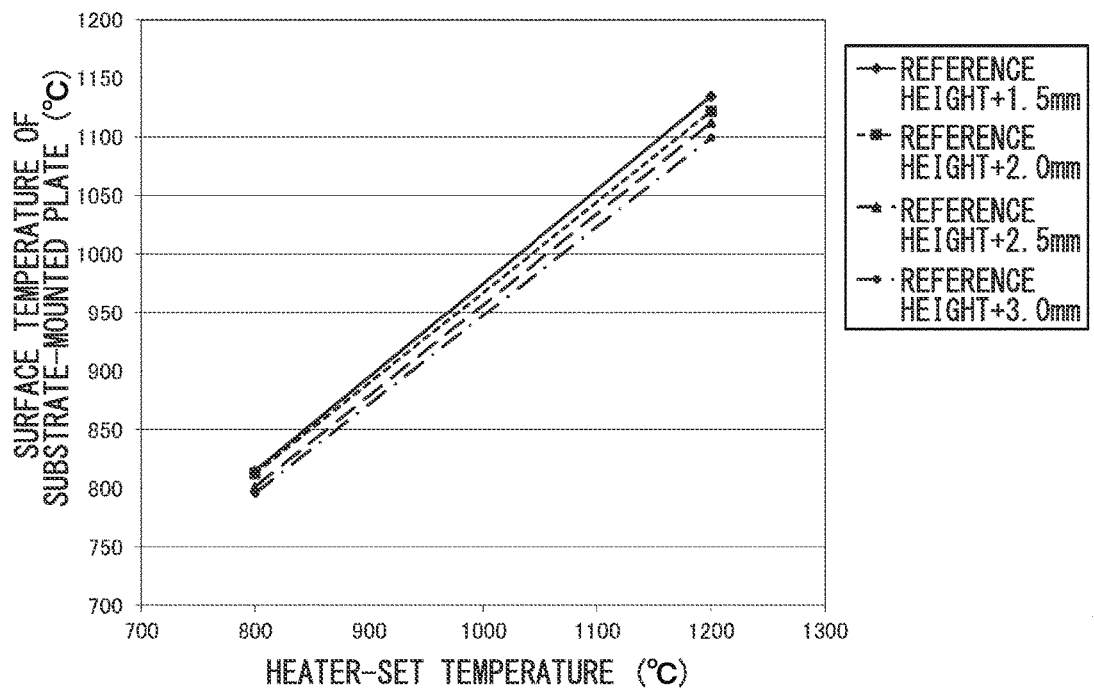
FIG. 3 is an explanatory view for illustrating a thermocouple-location-adjusting step of the method of adjusting vapor-phase growth apparatus according to an embodiment of the present invention (Part 1).

The relationship between the heater-set temperature and the surface temperature of substrate-mounted plate for each thermocouple height (S1) is investigated before correcting the vapor-phase growth apparatus 1. The graphed results are shown in FIG. 3. In FIG. 3, the horizontal axis represents heater-set temperature (° C.), and the vertical axis represents the surface temperature of substrate-mounted plate (° C.).

When the heater-set temperature is 800° C. and the reference heights were set to +1.5 mm, +2.0 mm, +2.5 mm and +3.0 mm, the surface temperatures of substrate-mounted plate were 814.8° C., 812.4° C. 801.1° C., and 795.7° C., respectively.

When the heater-set temperature is 1200° C. and the reference heights were set to +1.5 mm, +2.0 mm, +2.5 mm and +3.0 mm, the surface temperatures of substrate-mounted plate were 1134.5° C., 1121.7° C., 1111.9° C. and 1099.0° C., respectively.

In the thermocouple-location-adjusting step, when the substrate-mounted plate, the heater and the thermocouple are placed in the order, it is preferable to adjust the relative location between the heater and the thermocouple by using a device of adjusting thermocouple height 36 which includes a movement control device for controlling the movement and the moving device for vertically moving the thermocouple.

Next, according to above results, a relationship between the thermocouple heights and the surface temperatures of substrate-mounted plate formula is created (S3).

Figure 4:
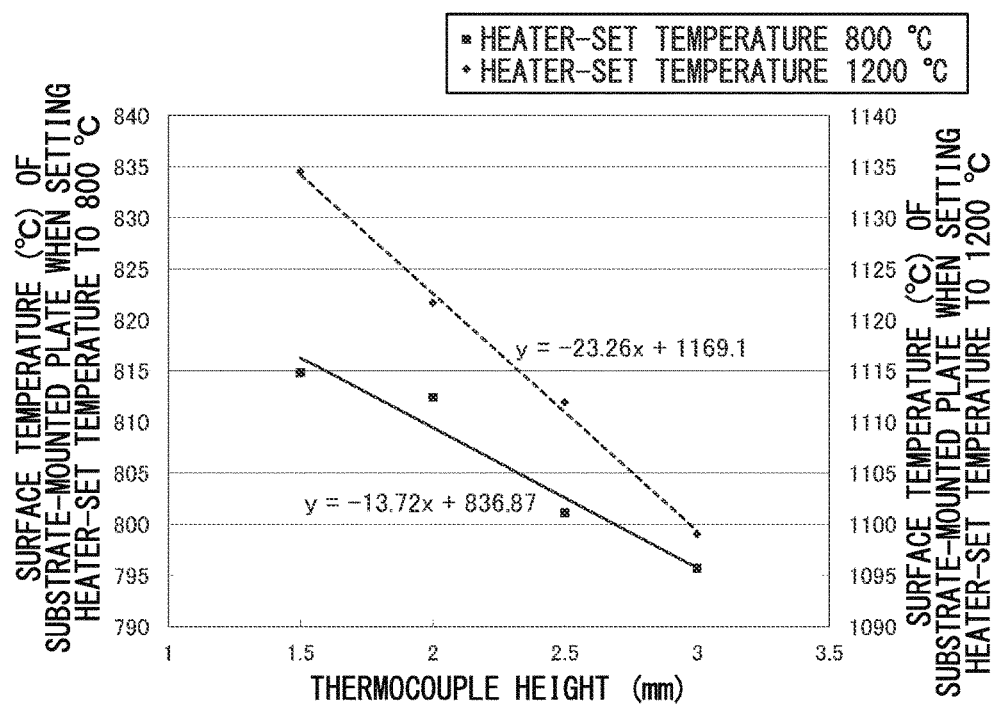
FIG. 4 is an explanatory view for illustrating a thermocouple-location-adjusting step of the method of adjusting vapor-phase growth apparatuses according to an embodiment of the present invention (Part 2).
Figure 5:
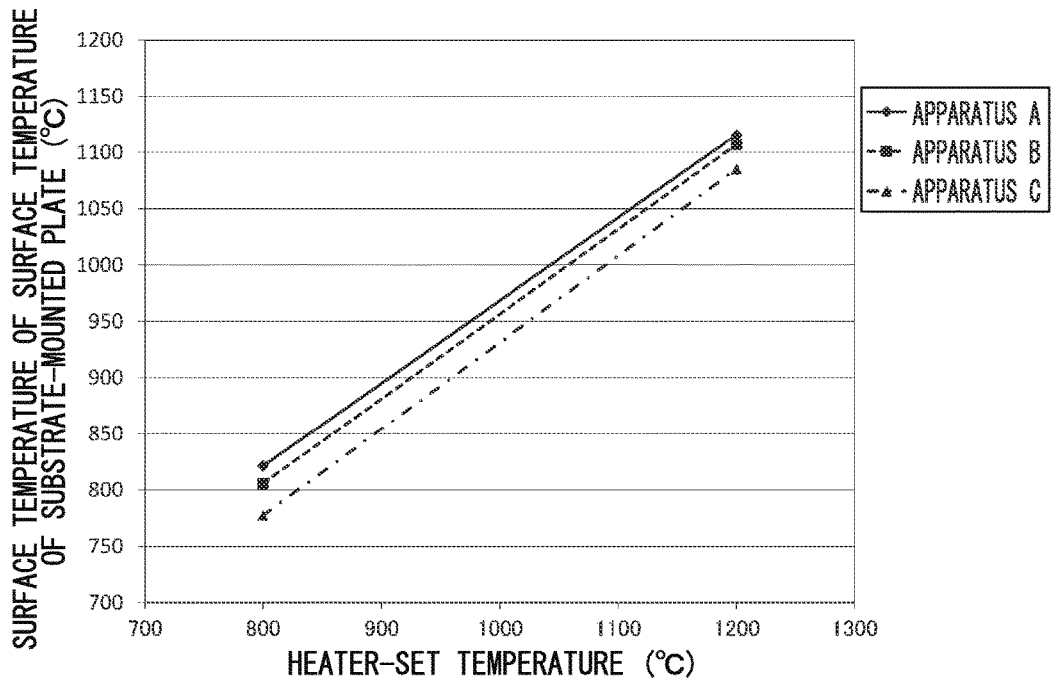
FIG. 5 is an explanatory view for illustrating an example of individual difference among a plurality of vapor-phase growth apparatus.
Figure 6:
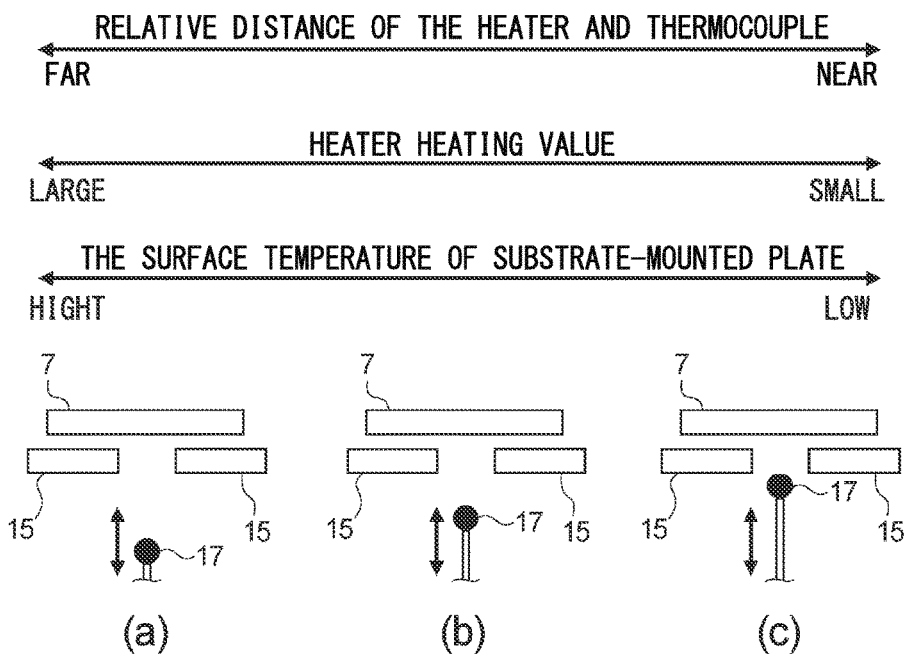
FIG. 6 is an explanatory view for illustrating the principle of the thermocouple-location-adjusting step of the method of adjusting vapor-phase growth apparatuses according to an embodiment of the present invention (Part 1).
Figure 7:
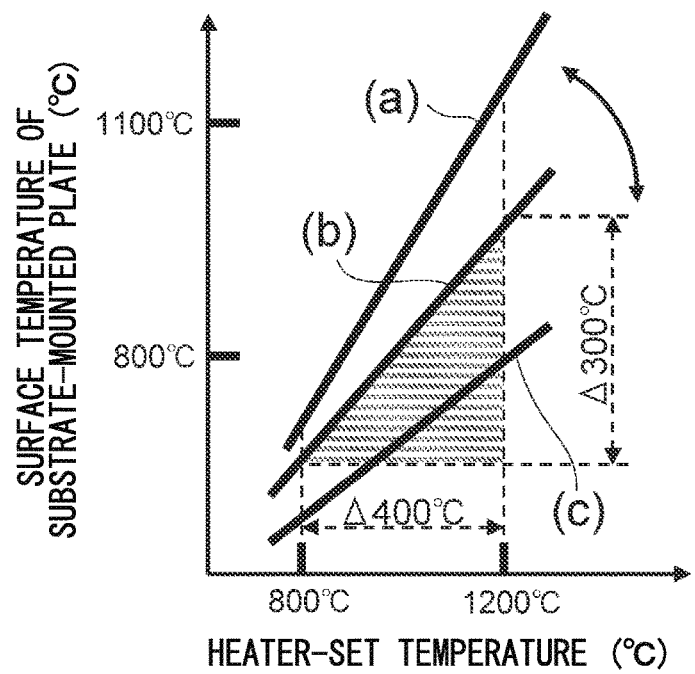
FIG. 7 is an explanatory view for illustrating the principle of the thermocouple-location-adjusting step of the method of adjusting vapor-phase growth apparatus according to an embodiment of the present invention (Part 2).
Figure 8:
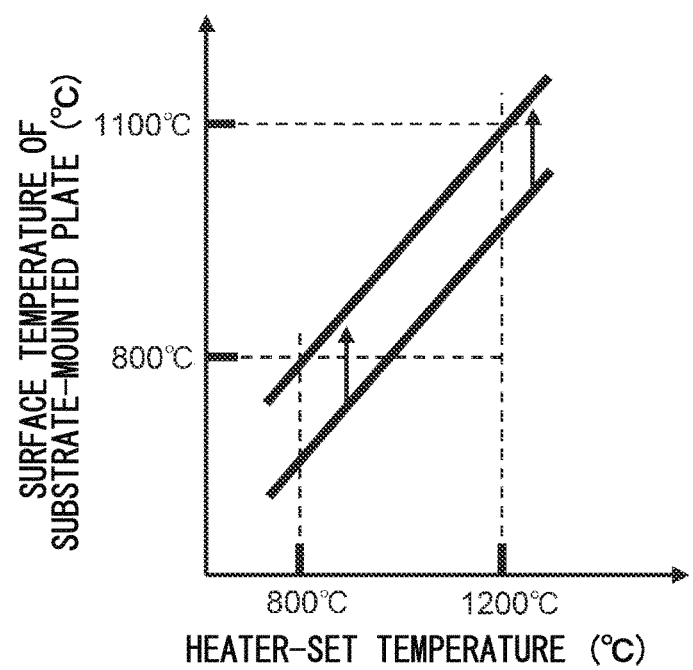
FIG. 8 is an explanatory view for illustrating the principle of the thermocouple-location-adjusting step of the method of adjusting vapor-phase growth apparatuses according to an embodiment of the present invention (Part 3).

As shown in FIG. 4, the above results were graphed at each heater-set temperature. In FIG. 4, the horizontal axis represents thermocouple height (mm), the left vertical axis represents surface temperature of substrate-mounted plate (° C.) when the heater-set temperature is set to 800° C., and the right vertical axis represents the surface temperature of substrate-mounted plate (° C.) when the heater-set temperature is set to 1200° C. In the following description, the surface temperature of substrate-mounted plate when the heater-set temperature is set to T° C. is referred to $y_T$(° C.).

When the heater-set temperature is 800° C., the height of the thermocouple 17 from the reference height is x (mm), and a surface temperature of substrate-mounted plate is $y_{800}$, (° C.), the following equation (1) is obtained by treating the above four data as a linear function using the least square method:

$$y_{800}=-13.72x+836.87 \quad (1)$$

Similarly, when the heater-set temperature is 1200° C., the following equation (2) is obtained by treating the above four data at as a linear function using the least square method.

$$y1200=-23.26x+1169.1 \quad (2)$$

As described above, by changing the thermocouple height x, it is possible to correct the temperature change rate. Therefore, the thermocouple height x when the temperature change rate is 300° C./400° C. (S5) is calculated.

In order to make the temperature change rate to 300° C./400° C., the difference between the surface temperature of substrate-mounted plate when heater-set temperature of 800° C. and the surface temperature of substrate-mounted plate when heater-set temperature is 1200° C. should be 300° C., and that is, $y_{1200}-y_{800}=300°$ C. In other words, the equation (3) is obtained from the equations (1) and (2).

$$(-23.26x+1169.1)-(-13.72x+836.87)=300 \quad (3)$$

By solving the equation (3), x=about 3.5 (mm) is obtained.

Therefore, when a thermocouple height is set to +3.5 mm, a temperature change rate is 300° C./400° C.

<Temperature-Control-Value-Correcting Step>

The temperature-control-value-correcting step will be explained. In this step, the heater temperature control value with respect to the heater temperature-set value is corrected. Specifically, the correction is carried out so that the surface temperature of substrate-mounted plate is 800° C. when the heater-set temperature is set to 800° C. (the surface temperature of substrate-mounted plate is 1100° C., when heater-set temperature is set to 1200° C.).

For this purpose, first, the correction value of the heater temperature control value is calculated (S7).

When the thermocouple height is +3.5 mm of the reference height and the heater-set temperature is 800° C., the surface temperature of substrate-mounted plate is 788.9° C. from the equation (1).

In this case, the difference between the heater-set temperature (800° C.) and the surface temperature of substrate-mounted plate (788.9° C.) is 11.1° C. By dividing this value by the temperature change rate, the correction value of the heater temperature control value for the actual heater-set temperature is obtained. In this case, it is +15° C.

Then, by actually adjusting the thermocouple height of the vapor-phase growth apparatus 1 to +3.5 mm, and the heater temperature control value was corrected to +15° C. (S9, S11).

Heating was carried out in order to verify the effects of adjusting the vapor-phase growth apparatus 1 (thermocouple height: +3.5 mm; the correction value of the heater temperature control value: +15° C.).

As a result, the surface temperature of substrate-mounted plate was 798.1° C. when the heater-set temperature was set to 800° C. The surface temperature of substrate-mounted plate was 1103.2° C. when the heater-set temperature was set to 1200° C. These values are within the reference ranges described above (the reference range is 800±2.5° C. when 800° C. and the reference range is 1100±5.0° C. when 1100° C.). The results are preferable.

By performing the adjustment as described above for each one of the plurality of vapor-phase growth apparatuses, it is possible to eliminate the individual difference among apparatuses.

As described above, in this embodiment, it is possible to adjust the relationship of the heater-set temperature and the surface temperature of the substrate-mounted plate for the vapor-phase growth apparatus 1 to a predetermined value by adjusting the relative location of the heater 15 and thermocouple 17 so that the temperature change rate was a predetermined value, and by correcting the heater temperature control value with respect to the heater temperature-set value. Then, by performing such adjustments for each apparatus, it is possible to obtain the same surface temperature of the substrate-mounted plate by setting the same heater-set temperature, and as a result, it is possible to eliminate the individual difference among the apparatuses.

In the above description, it has been determined by calculating the correction value of the heater temperature control value. It is also possible to obtain a correction value based on the difference between a measured value and a heater temperature setting value by adjusting the thermocouple height and measuring the temperature of the substrate-mounted plate after heating by the heater.

DESCRIPTION OF THE CODE 1 vapor-phase growth apparatus
3 deposition chamber
5 susceptor
7 substrate-mounted plate
9 rotation axis
11 gas inlet
13 gas outlet
15 heater
16 heating surface of heater
17 thermocouple
31 device of setting heater temperature
33 device of correcting heater-set temperature
35 device of controlling heater
36 device of adjusting thermocouple height

The invention claimed is:

1. A method of adjusting vapor-phase growth apparatuses in which an individual difference of a heater-set temperature and a surface temperature of a substrate-mounted plate among the vapor-phase growth apparatuses is eliminated wherein the vapor-phase growth apparatuses are apparatuses in which a thin film is deposited on a substrate placed on a substrate-mounted plate by supplying raw material gas on the substrate while heating the substrate by a heater which is controlled by a thermocouple, wherein the method comprises:

a thermocouple-location-adjusting step, in which a relative location of the thermocouple and the heater is adjusted so that an change amount of the surface temperature of the substrate-mounted plate with respect to an change amount of the heater-set temperature reaches a predetermined value; and a temperature-control-value-correcting step, in which the thermocouple is disposed at the relative location adjusted in the thermocouple-location-adjusting step, the surface temperature of the substrate-mounted plate is obtained when the substrate-mounted plate is heated by the heater in accordance with a prescribed temperature-set value, and a temperature-control value with respect to a temperature-set value is corrected on a basis of a difference between the temperature-set value at this time and the surface temperature of the substrate-mounted plate.

2. The method of adjusting a vapor-phase growth according to claim 1, wherein in the temperature-control-value-correcting step, a correction value is determined on the basis of a difference between the temperature-set value and the measured value and the change amount of the surface temperature of the substrate-mounted plate with respect to the change amount of the heater-set temperature.

* * * * *